United States Patent
Lin et al.

(10) Patent No.: US 12,087,820 B2
(45) Date of Patent: *Sep. 10, 2024

(54) SEMICONDUCTOR DEVICE HAVING A PLURALITY OF III-V SEMICONDUCTOR LAYERS

(71) Applicant: Taiwan Semiconductor Manufacturing Company Ltd., Hsinchu (TW)

(72) Inventors: Yu-Syuan Lin, Changhua County (TW); Jiun-Lei Yu, Hsinchu County (TW); Ming-Cheng Lin, Yilan County (TW); Chun Lin Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,461

(22) Filed: Apr. 17, 2023

(65) Prior Publication Data

US 2023/0253455 A1    Aug. 10, 2023

Related U.S. Application Data

(63) Continuation of application No. 16/947,284, filed on Jul. 27, 2020, now Pat. No. 11,631,741, which is a
(Continued)

(51) Int. Cl.
*H01L 29/10* (2006.01)
*H01L 27/085* (2006.01)
(Continued)

(52) U.S. Cl.
CPC ...... *H01L 29/1075* (2013.01); *H01L 29/0649* (2013.01); *H01L 29/0661* (2013.01); *H01L 29/475* (2013.01); *H01L 29/7786* (2013.01); *H01L 29/7787* (2013.01); *H02M 3/1588* (2013.01); *H01L 29/2003* (2013.01); *H02M 3/003* (2021.05); *Y02B 70/10* (2013.01)

(58) Field of Classification Search
CPC ............ H01L 29/1075; H01L 29/0649; H01L 29/0661; H01L 29/475; H01L 29/7786; H01L 29/7787; H01L 29/2003; H01L 27/085; H01L 29/778; H01L 29/42372; H01L 29/7849; H01L 2924/1033; H02M 3/1588; H02M 3/003; Y02B 70/10
See application file for complete search history.

(56) References Cited

U.S. PATENT DOCUMENTS 4,830,980 A  5/1989 Hsieh
5,021,857 A  6/1991 Suehiro
(Continued)

OTHER PUBLICATIONS

Gendron, K.: Twin-Well CMOS Integration. In: Journal of the Microelectronic Engineering Conference, vol. 8, 1997, No. 1, 1-3.

*Primary Examiner* — Herve-Louis Y Assouman
(74) *Attorney, Agent, or Firm* — Haynes and Boone, LLP (57) ABSTRACT

A semiconductor device includes a transistor, a semiconductor layer, an active region and a conductive layer. The active region is in the semiconductor layer. The conductive layer is configured to maintain a channel in the active region when the transistor is triggered to be conducted.

20 Claims, 11 Drawing Sheets

Related U.S. Application Data continuation of application No. 16/219,281, filed on Dec. 13, 2018, now Pat. No. 10,727,329, which is a continuation of application No. 15/664,767, filed on Jul. 31, 2017, now Pat. No. 10,170,613, which is a continuation of application No. 15/014,842, filed on Feb. 3, 2016, now Pat. No. 9,722,065.

(51) Int. Cl.

| | | |
|---|---|---|
| *H01L 29/06* | (2006.01) | |
| *H01L 29/20* | (2006.01) | |
| *H01L 29/423* | (2006.01) | |
| *H01L 29/47* | (2006.01) | |
| *H01L 29/778* | (2006.01) | |
| *H01L 29/78* | (2006.01) | |
| *H02M 3/158* | (2006.01) | |
| *H02M 3/00* | (2006.01) | |

(56) References Cited

U.S. PATENT DOCUMENTS

| | | | |
|---|---|---|---|
| 7,868,353 | B2 | 1/2011 | Machida |
| 8,138,529 | B2 | 3/2012 | Wu |
| 9,722,065 | B1 | 8/2017 | Lin |
| 10,727,329 | B2 | 7/2020 | Lin |
| 11,631,741 | B2 * | 4/2023 | Lin ............... H01L 29/0649 257/194 |
| 2005/0189582 | A1 | 9/2005 | Mikolajick |
| 2006/0022217 | A1 | 2/2006 | Passlack |
| 2006/0124960 | A1 | 6/2006 | Hirose |
| 2007/0228477 | A1 | 10/2007 | Suzuki |
| 2008/0128750 | A1 | 6/2008 | Enicks |
| 2009/0230482 | A1 | 9/2009 | Kato |
| 2012/0235209 | A1 | 9/2012 | Briere |
| 2013/0256829 | A1 | 10/2013 | Kikkawa |
| 2014/0061658 | A1 | 3/2014 | Chiu |
| 2014/0332887 | A1 | 11/2014 | Zhang |
| 2015/0034972 | A1 | 2/2015 | Kuraguchi |
| 2016/0293596 | A1 | 10/2016 | Fareed |

* cited by examiner

SEMICONDUCTOR DEVICE HAVING A PLURALITY OF III-V SEMICONDUCTOR LAYERS

PRIORITY DATA

The present application is a continuation application of Ser. No. 16/947,284, issuing as U.S. Pat. No. 11,631,741, which is a continuation of U.S. patent application Ser. No. 16/219,281, now U.S. Pat. No. 10,727,329, which is a continuation of U.S. Pat. Ser. No. 15/664,767, filed Jul. 31, 2017, now U.S. Pat. No. 10,170,613 which is a continuation application of U.S. patent application Ser. No. 15/014,842, filed Feb. 3, 2016, entitled "SEMICONDUCTOR DEVICE," now U.S. Pat. No. 9,722,065, which are hereby incorporated by reference in their entirety.

BACKGROUND

Recently, gallium nitride (GaN) High Electron Mobility Transistor (HEMT) devices have caught a lot of attention regarding their high potential to replace silicon (Si) or silicon carbide (SiC) for use as High Voltage (HV) devices. GaN HEMTs are typically fabricated by applying ohmic source and drain contacts and a Schottky gate contact on top of an epitaxially grown structure including an aluminum gallium nitride (AlGaN) barrier layer on a GaN channel layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
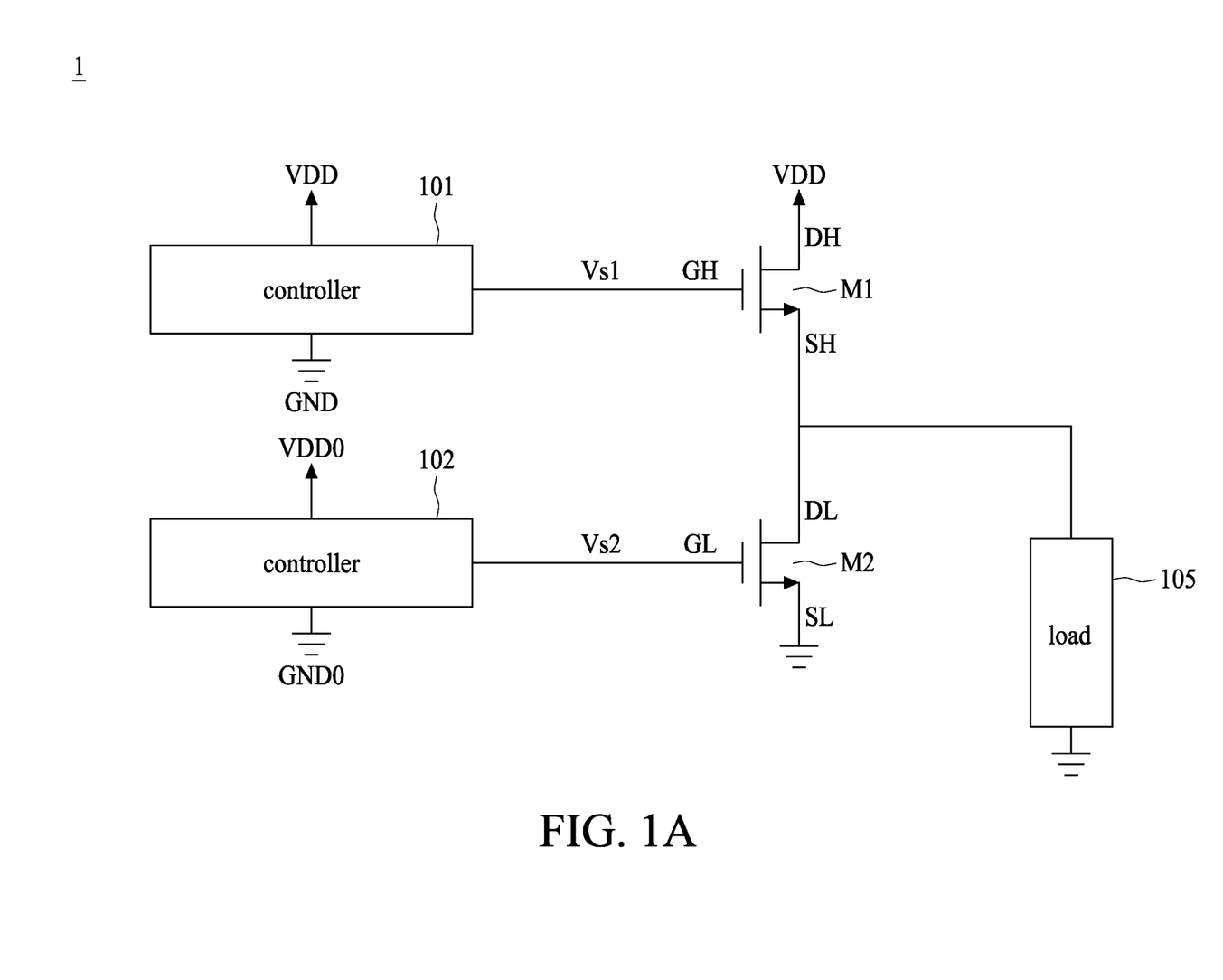
FIG. 1A is a diagram of a semiconductor device, in accordance with some embodiments of the present disclosure.

FIG. 1A is a diagram of a semiconductor device 1, in accordance with some embodiments of the present disclosure. Referring to FIG. 1A, the semiconductor device 1 includes a first controller 101, a second controller 102, a first transistor M1 (also called a high-side transistor), a second transistor M2 (also called a low-side transistor) and a load 105.

Moreover, the semiconductor device 1 is configured to operate in different power domains, including a first power domain defined by a supply voltage VDD0 and a ground voltage GND0, and a second power domain defined by a supply voltage VDD and a ground voltage GND. For example, the supply voltage VDD0 is approximately 1.8 Volts (V) and the supply voltage VDD is approximately 600 V. Additionally, the ground voltage GND0 is approximately 0 V, and the ground voltage VDD is approximately 0 V. Alternatively, a voltage level of the ground voltage GND0 is different from that of the ground voltage GND.

The semiconductor device 1 may serve as a power converter. For example, the semiconductor device 1 is classified as one of a switched-mode power supply, a rectifier, a power inverter, a motor-generator set, a DC-to-DC converter, and a transformer. A typical power converter includes a switching circuit, a driver and a low-voltage circuit. For converting a supply voltage, the power converter is implemented with switches.

The first transistor M1 and the second transistor M2 receive the second power domain of the supply voltage VDD and the ground voltage GND and are connected in a cascade configuration between the supply voltage VDD and the ground voltage GND.

In one or more embodiments, each of the first transistor M1 and the second transistor M2 includes a power field-effect transistor (FET), such as a double-diffused metal-oxide-semiconductor (DMOS) transistor. In further embodiments, each of the first transistor M1 and the second transistor M2 includes another suitable device, such as an insulated-gate bipolar transistor (IGBT), a field effect transistor (FET), etc. In the present embodiment, each of the first transistor M1 and the second transistor M2 includes an n-type metal-oxide-semiconductor (NMOS) field-effect transistor. In another embodiment, each of the first transistor M1 and the second transistor M2 includes a p-type metal-oxide-semiconductor (PMOS) field-effect transistor.

Furthermore, the load 105 includes resistors, capacitors, electric circuits, or other electrical devices.

The first controller 101 is configured to receive the second power domain, and provide a signal Vs1 of a relative high voltage level for driving the first transistor M1. In addition, the second controller 102 is configured to receive the first power domain, and provide a signal Vs2 of a relative low voltage level for driving the second transistor M2.

A drain terminal DH of the first transistor M1 receives the supply voltage VDD. A gate terminal GH of the first transistor M1 is coupled to an output of the first controller 101 and receives the signal Vs1. A source terminal SH of the first transistor M1 is coupled to the load 105. Moreover, a source terminal SL of the second transistor M2 receives the ground voltage GND. A gate terminal GL of the second transistor M2 is coupled to an output of the second controller 102 and receives the signal Vs2. A drain terminal DL of the second transistor M2 is coupled to the source terminal SH of the first transistor M1 and also to the load 105.

In operation, the first transistor M1 and the second transistor M2 are designed to be not conducted at the same time. In such a manner, the first transistor M1 and the second transistor M2 are able to provide a suitable voltage to the load 105 such that the load 102 can work normally. If both the first transistor M1 and the second transistor M2 were to operate at a conducted state, the first transistor M1 and the second transistor M2 provide an unsuitable voltage to the load 105. Consequently, the load 105 cannot work normally.

In some existing semiconductor devices, a high-side transistor and a low-side transistor are not integrated in an integrated circuit (IC). The high-side transistor and the low-side transistor are each manufactured as an independent component, and are then mounted on a mother board. In such existing approaches, if the high-side transistor and the low-side transistor were integrated in a single IC, the high-side transistor might not be conducted in a situation that the high-side transistor should be conducted and the low-side transistor should be not conducted, which will be described in detail with reference to FIG. 1B.

By contrast, in the present disclosure, the first transistor M1 and the second transistor M2 can be integrated in a single integrated chip without affecting the function of the first transistor M1, which will also be described in detail with reference to FIG. 1B.

Figure 1B:
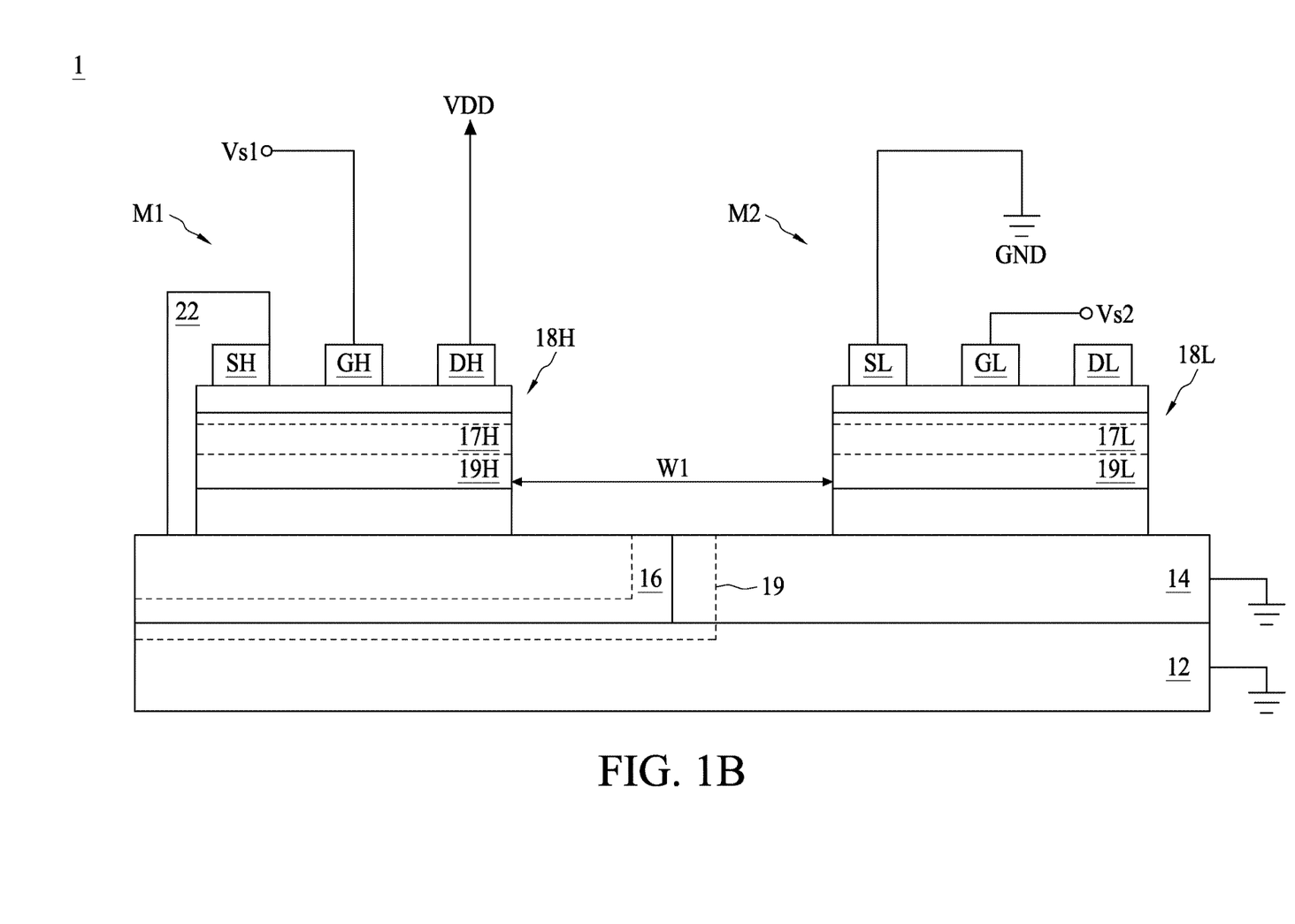
FIG. 1B is a cross-sectional view of the semiconductor device shown in FIG. 1A, in accordance with some embodiments of the present disclosure.

FIG. 1B is a cross-sectional view of the semiconductor device 1 shown in FIG. 1A, in accordance with some embodiments of the present disclosure. Referring to FIG. 1B, in addition to the first transistor M1 and the second transistor M2, the semiconductor device 1 includes a substrate 12, a first conductive layer 16, a second conductive layer 14 and a conductive feature 22.

In some embodiments, the substrate 12 includes silicon germanium, gallium arsenic, silicon carbon, or other suitable semiconductor materials. In some embodiments, the substrate 12 further includes doped regions such as a P-well and an N-well (not shown). In some other embodiments, the substrate 10 further includes other features such as a buried layer, or an epitaxy layer. Furthermore, in some embodiments, the substrate 12 is semiconductor on insulator such as silicon on insulator (SOI). In other embodiments, the semiconductor substrate 12 includes a doped epi layer, a gradient semiconductor layer, or further includes a semiconductor layer overlying another semiconductor layer of a different type such as a silicon layer on a silicon germanium layer. In some other examples, a compound semiconductor substrate includes a multilayer silicon structure or a silicon substrate may include a multilayer compound semiconductor structure. In some embodiments, the substrate 12 may include other elementary semiconductors such as germanium and diamond. In some embodiments, the substrate 12 includes a compound semiconductor such as silicon carbide, gallium arsenide, indium arsenide, or indium phosphide.

The first transistor M1 includes a first conductive layer 16 on the substrate 12, and a first semiconductor layer 18H of, for example, a III-V family (hereinafter the "first III-V layer 18H") on the first conductive layer 16. Furthermore, a first active region 19H (shown in a solid box) of the first transistor M1 is defined in the first III-V layer. Moreover, a first channel 17H (shown in a dotted box) is defined in the first active region 19H.

In an embodiment, the first III-V layer 18H includes a gallium nitride (GaN) layer (not specifically shown) and an aluminum gallium nitride (AlGaN) layer (not specifically shown) on the GaN layer. Since bandgap of the GaN layer is different from that of the AlGaN layer, a two-dimensional electron gas (2-DEG) region labeled as the first channel 17H is generated in the AlGaN layer near an interface between the GaN layer and the AlGaN layer. However, the disclosure is not limited thereto. In another embodiment, the first III-V layer 18H may include gallium arsenide, indium arsenide, indium gallium arsenide, indium phosphide, gallium nitride, indium antimonide, gallium antimonide, gallium phosphide, aluminum nitride, indium nitride, indium aluminum nitride and/or any ternary or quaternary compounds thereof or mixtures or alloys thereof.

The first conductive layer 16 is disposed on the substrate 12, and serves as a bulk of the first transistor M1. A voltage level applied to the first conductive layer 16 determines whether the first channel 17H can be held or maintained in the first active region 19H. Specifically, if the voltage level at the first conductive layer 16 is not greater than that at the gate terminal GH of the first transistor M1 and the voltage difference therebetween is greater than a first threshold voltage level such as 200 V, the first channel 17H is not held. On the other hand, if the voltage level at the first conductive layer 16 is not greater than that at the gate terminal GH of the first transistor M1 and the voltage difference therebetween is not greater than the first threshold voltage level, the first channel 17H is held. For example, if the voltage level at the first conductive layer 16 is substantially equal to that at the gate terminal GH of the first transistor M1, which means the voltage level at the first conductive layer 16 is not greater than that at the gate terminal GH of the first transistor M1 while the voltage difference is not greater than the first threshold voltage level, the first channel 17H is held.

Alternatively, if the voltage level at the first conductive layer 16 is greater than that at the gate terminal GH of the first transistor M1 and the voltage difference therebetween is greater than a second threshold voltage level such as 200 V, the first channel 17H is not held. The second threshold voltage level may be the same, or different from the first threshold voltage level. On the other hand, if the voltage level at the first conductive layer 16 is greater than that at the gate terminal GH of the first transistor M1 and the voltage difference therebetween is not greater than the second threshold voltage level, the first channel 17H is held.

Given the above, if the voltage difference between the first conductive layer 16 and the gate terminal GH of the first transistor M1 falls within a threshold voltage level, the first channel 17H is held.

The second transistor M2 includes a second conductive layer 14 on the substrate 12, and a second semiconductor layer 18L of, for example, a III-V family (hereinafter the "second III-V layer 18L") on the second conductive layer 14.

The second III-V layer 18L is separated from the first III-V layer 18H by a distance W1. In an embodiment, the distance W1 is approximately 100 μm. Specifically, the first III-V layer 18H and the second III-V layer 18L are fabricated as independent components physically separated from each other on the same substrate 12. Also, the first III-V layer 18H is electrically separated from the second III-V layer 18L. Furthermore, a second active region 19L of the second transistor M2 is defined in the second III-V layer 18L. Moreover, a second channel 17L is defined in the second active region 19L.

In an embodiment, the second III-V layer 18L includes a GaN layer and a AlGaN layer on the GaN layer, but the disclosure is not limited thereto. Since bandgap of the GaN layer is different from that of the AlGaN layer, as previously discussed, a two-dimensional electron gas (2-DEG) region labeled as the second channel 17L is generated in the AlGaN layer near an interface between the GaN layer and the AlGaN layer. In another embodiment, the second III-V layer 18L may include gallium arsenide, indium arsenide, indium gallium arsenide, indium phosphide, gallium nitride, indium antimonide, gallium antimonide, gallium phosphide, and/or any ternary or quaternary compounds thereof or mixtures or alloys thereof.

The second conductive layer 14 is disposed on the substrate 12, and serves as a bulk of the second transistor M2. A voltage level applied to the second conductive layer 14 determines whether the second channel 17L is held or maintained in the second active region 19L.

Specifically, if the voltage level at the second conductive layer 14 is not greater than that at the gate terminal GL of the second transistor M2 and the voltage difference therebetween is greater than a third threshold voltage level such as 200 V, the second channel 17L is not held. On the other hand, if the voltage level at the second conductive layer 14 is not greater than that at the gate terminal GL of the second transistor M2 and the voltage difference therebetween is not greater than the third threshold voltage level, the second channel 17L is held. For example, if the voltage level at the second conductive layer 14 is substantially equal to that at the gate terminal GL of the second transistor M2, which means the voltage level at the second conductive layer 14 is not greater than that at the gate terminal GL of the second transistor M2 and the voltage difference therebetween is not greater than the third threshold voltage level, the second channel 17L is held.

Alternatively, if the voltage level at the second conductive layer 14 is greater than that at the gate terminal GL of the second transistor M2 and the voltage difference therebetween is greater than a fourth threshold voltage level such as 200 V, the second channel 17L is not held. The fourth threshold voltage level may be the same, or different from the third threshold voltage level. On the other hand, if the voltage level at the second conductive layer 14 is greater than that at the gate terminal GL of the second transistor M2 and the voltage difference therebetween is not greater than the fourth threshold voltage level, the second channel 17L is held.

Given the above, because the substrate 12 and the second conductive layer 14 are connected to the ground voltage GND, the voltage difference between the second conductive layer 14 and the gate terminal GL of the second transistor M2 falls within a threshold voltage level, the second channel 17L is held.

In some embodiments, the substrate 12 is doped with a p-type dopant, the first conductive 16 layer is doped with an n-type dopant and the second conductive layer 14 is doped with a p-type dopant. Since the dopant type of the substrate 12 is opposite to the first conductive layer 16, a portion of a depletion region 19 is generated at an interface between the substrate 12 and the first conductive layer 16. Similarly, since the dopant type of the second conductive layer 14 is opposite to the first conductive layer 16, another portion of the depletion region 19 is generated at an interface between the second conductive layer 14 and the first conductive layer 16. As a result, the first conductive layer 16 is electrically isolated from the substrate 12, and also electrically isolated from the first conductive layer 14. Due to the electrical isolation, the voltage level at the first conductive layer 16 can be kept unchanged. In contrast, without the electrical isolation, a discharge path from the first conductive layer 16 to the substrate 12, or to the second conductive layer 14 may otherwise exist and adversely affect the voltage level at the first conductive layer 16.

In another embodiment, the substrate 12 is doped with an n-type dopant, the first conductive 16 layer is doped with a p-type dopant and the second conductive layer 14 is doped with an n-type dopant. As previously discussed, the first conductive layer 16 is electrically isolated from the substrate 12 and the second conductive layer 14. Effectively, the voltage level at the first conductive layer 16 can be kept unchanged.

The conductive feature 22 is configured to couple the source terminal SH of the first transistor M1 to the first conductive layer 16. As such, the first conductive layer 16 is biased at the same voltage level as the source terminal SH of the first transistor M1. In an embodiment, the first transistor M1 is configured to conduct when the gate terminal GH is biased at approximately 600V, and the second transistor M2 is configured to conduct when the gate terminal GL is biased at approximately 6V.

Assume that the supply voltage VDD is 600V, the signal Vs1 having a voltage level of 600V (or 606V) is applied to the gate terminal GH, and signal Vs2 having a voltage level of 0V is applied to the gate terminal GL. In operation, the first transistor M1 is conducted in response to the signal Vs1, and the second transistor M2 is not conducted in response to the signal Vs2. Conduction of the first transistor M1 results in a voltage level of approximately 600V at the source terminal SH of the first transistor M1, which is substantially the same as the supply voltage VDD. Further, with the conductive feature 22, the first conductive layer 16 is biased at the same voltage level of 600V as the source terminal SH of the first transistor M1. That is, the voltage level at the first conductive layer 16 is 600V. Since the voltage level at the first conductive layer 16 is substantially equal to that at the gate terminal GH of the first transistor M1, the first channel 17H is held and the first transistor M1 can be kept at the conducted state. Accordingly, the first conductive layer 16 is configured to maintain the first channel 17H in the first active region 19H when the first transistor M1 is triggered to be conducted.

Assume that an existing semiconductor device is similar in structure to the semiconductor device 1 except that, for example, the first conductive layer 16, the second conductive layer 14 and the conductive feature 22 are absent. As such, in the existing semiconductor device the first transistor M1 and the second transistor M2 are disposed on the substrate 12, which serves as a bulk for the first transistor M1 and the second transistor M2. Given the same supply voltage of 600V, signal Vs1 of 600V (or 406V) and signal Vs2 of 0V, in operation, the first transistor M1 is conducted in response to the signal Vs1, and the second transistor M2 is not conducted in response to the signal Vs2. Since the voltage level of the substrate 12, substantially equal to the ground voltage GND of 0V, is not greater than that at the gate terminal GH of the first transistor M1 of 600V and the voltage difference therebetween exceeds the first threshold voltage level, the first channel 17H is not held. Consequently, the first transistor M1 becomes not conducted. In that case, the first transistor M1 may malfunction and therefore the first transistor M1 and the second transistor M2 cannot provide a desired voltage to the load 105.

In contrast, in the semiconductor device 1 in accordance with the present disclosure, the first transistor M1 and the second transistor M2 have their respective bulks (the first conductive layer 16 and the second conductive layer 14). Moreover, the first conductive layer 16 is electrically isolated from the second conductive layer 14 and the substrate 12. Furthermore, the first conductive layer 16 is biased at the same voltage level as the source terminal SH of the first transistor M1 by the conductive feature 22. Effectively, the first channel 17H can be held and the first transistor M1 is kept at a conducted state when conducted.

Figure 2:
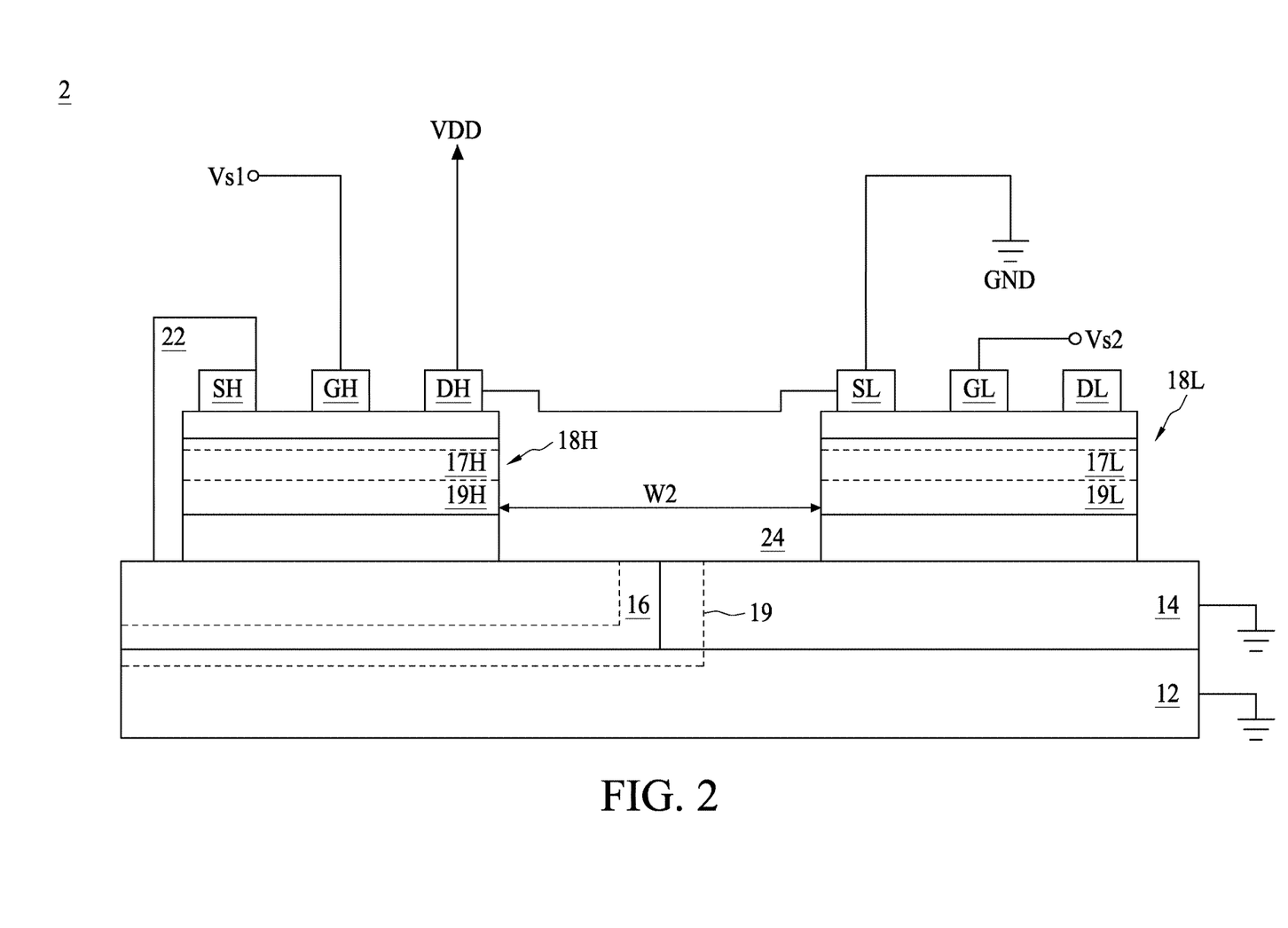
FIG. 2 is a diagram of a semiconductor device, in accordance with some embodiments of the present disclosure.

FIG. 2 is a diagram of a semiconductor device 2, in accordance with some embodiments of the present disclosure. Referring to FIG. 2, the semiconductor device 2 is similar to the semiconductor device 1 described and illustrated with reference to FIG. 1B except that, for example, the semiconductor device 2 further includes a barrier structure 24 sandwiched between the first III-V layer 18H and the second III-V layer 18L. The barrier structure 24 is configured to physically isolate the first III-V layer 18H and the second III-V layer 18L. In some embodiments, material of the barrier structure 24 includes dielectric material, such as gallium arsenide, indium arsenide, indium gallium arsenide, indium phosphide, gallium nitride, indium antimonide, gallium antimonide, gallium phosphide, aluminum nitride, indium nitride, indium aluminum nitride and/or any ternary or quaternary compounds thereof or mixtures or alloys thereof. The first III-V layer 18H is physically isolated from the first III-V layer 18H by a distance W2 of, for example, approximately 100 μm. With the barrier structure 24, the distance W2 is shorter than the distance W1 as discussed in the embodiment of FIG. 1A, resulting in a reduced area cost.

In the semiconductor device 2, as previously discussed with reference to FIG. 1B, the first transistor M1 and the second transistor M2 have their respective bulks, i.e., the first conductive layer 16 and the second conductive layer 14, respectively. Moreover, the first conductive layer 16 is electrically isolated from the second conductive layer 14 and the substrate 12. Furthermore, the first conductive layer 16 is biased at the same voltage level as the source terminal SH of the first transistor M1 by the conductive feature 22. Effectively, the first transistor M1 is kept at a conducted state when conducted and can therefore work normally.

Figure 3:
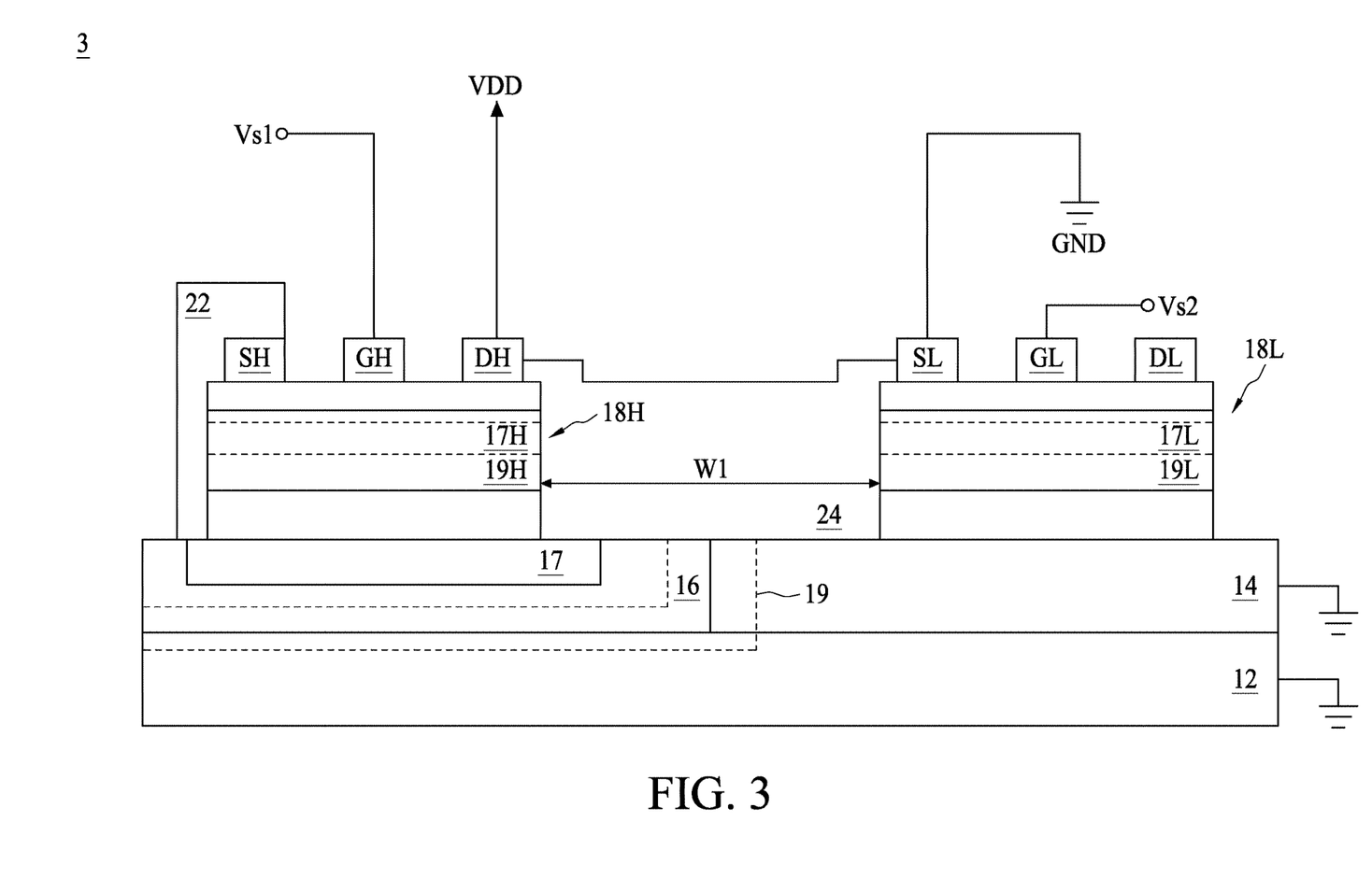
FIG. 3 is a diagram of a semiconductor device, in accordance with some embodiments of the present disclosure.

FIG. 3 is a diagram of a semiconductor device 3, in accordance with some embodiments of the present disclosure. Referring to FIG. 3, the semiconductor device 3 is similar to the semiconductor device 2 described and illustrated with reference to FIG. 2 except that, for example, the semiconductor device 2 further includes a conductive layer 17 in the first conductive layer 16. The conductive layer 17, which may be disposed under the first III-V layer 18H, has an opposite dopant type to the first conductive layer 16. Both the conductive layer 17 and the first conductive layer 16 are coupled to the source terminal SH of the first transistor M1. As a result, the conductive layer 17 has the same voltage level as the first conductive layer 16.

In the semiconductor device 3, as previously discussed with reference to FIG. 1B, the first transistor M1 and the second transistor M2 have their respective bulks, the first conductive layer 16 and the second conductive layer 14. In addition, the first conductive layer 16 is electrically isolated from the second conductive layer 14 and the substrate 12. Moreover, the first conductive layer 16 is biased at the same voltage level as the source terminal SH of the first transistor M1 by the conductive feature 22. Effectively, the first transistor M1 can be kept at a conducted state when conducted and therefore work normally.

Figure 4:
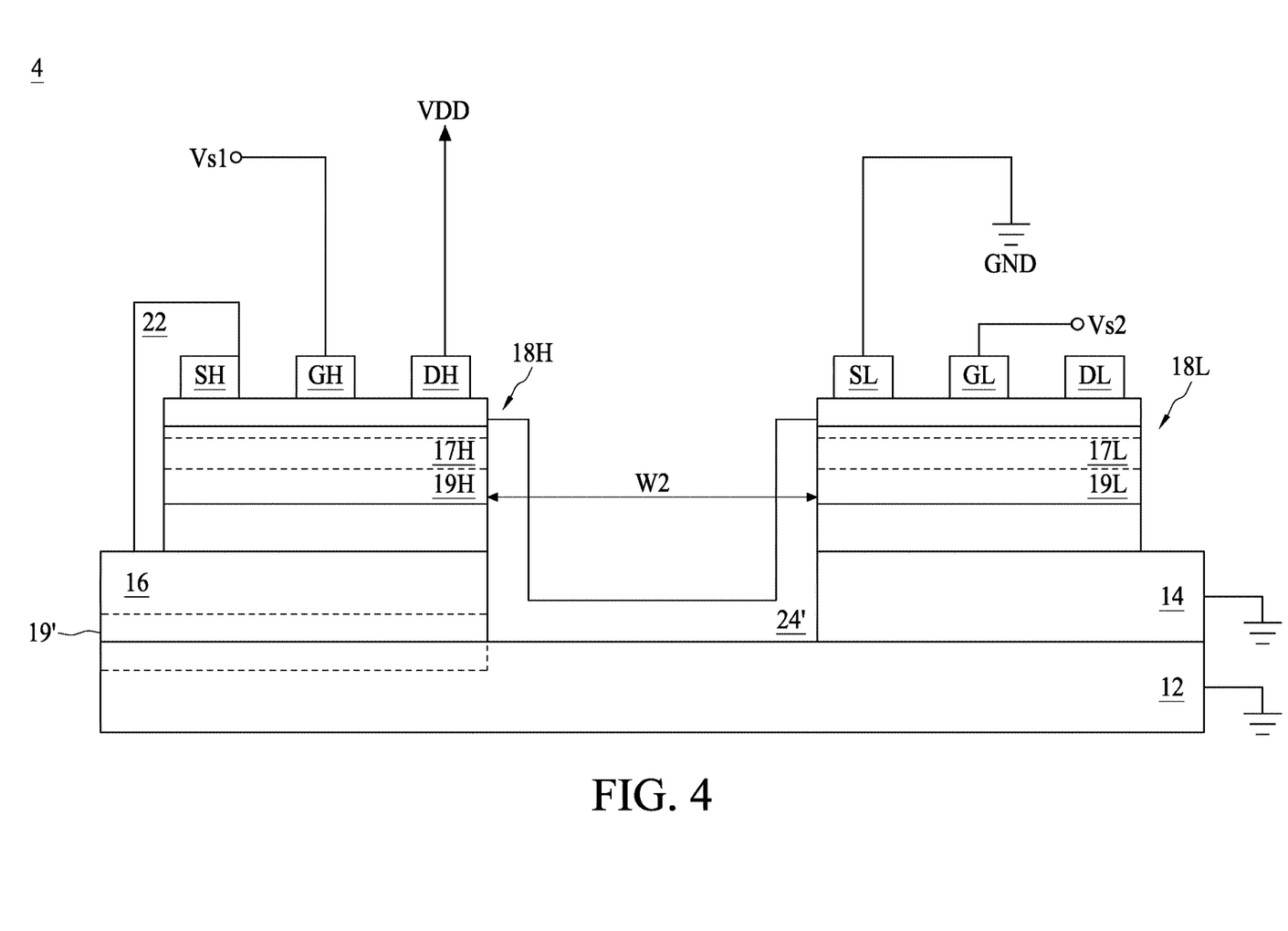
FIG. 4 is a diagram of a semiconductor device, in accordance with some embodiments of the present disclosure.

FIG. 4 is a diagram of a semiconductor device 4, in accordance with some embodiments of the present disclosure. Referring to FIG. 4, the semiconductor device 4 is similar to the semiconductor device 2 described and illustrated with reference to FIG. 2 except that, for example, the first conductive layer 16 is physically isolated from the second conductive layer 14 by a barrier structure 24'. Since the first conductive layer 16 and the second conductive layer 14 are no longer contiguous with each other, a depletion region 19' only exists between the first conductive layer 16 and the substrate 12. Moreover, the barrier structure 24' may be formed conformally on the substrate 12.

In the semiconductor device 4, as previously discussed with reference to FIG. 1B, the first transistor M1 and the second transistor M2 have their respective bulks, the first conductive layer 16 and the second conductive layer 14. Moreover, the first conductive layer 16 is electrically isolated from the second conductive layer 14 and the substrate 12. In addition, the first conductive layer 16 is biased at the same voltage level as the source terminal SH of the first transistor M1 by the conductive feature 22. Effectively, the first transistor M1 can be kept at a conducted state when conducted and therefore work normally.

Figure 5:
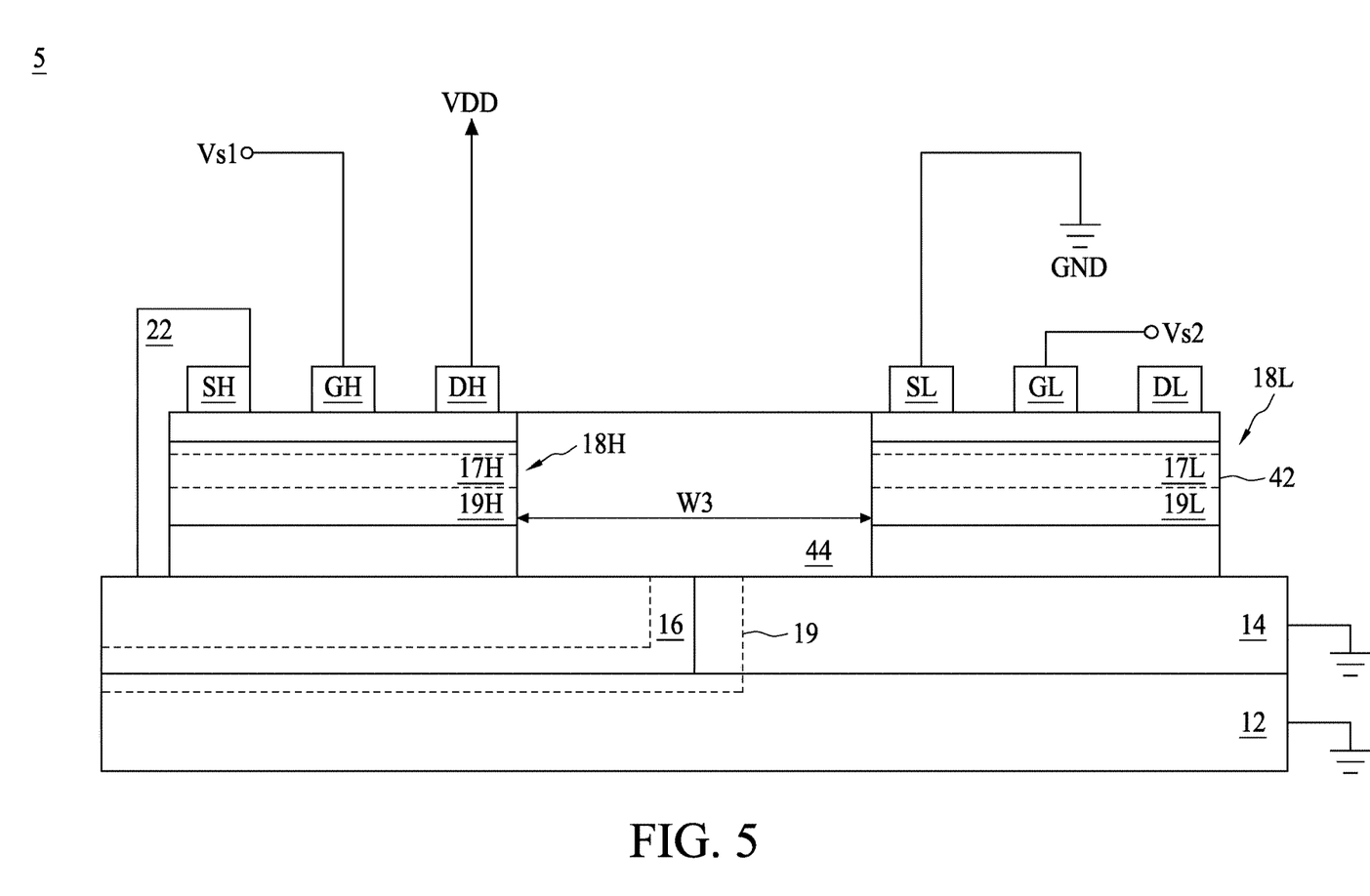
FIG. 5 is a diagram of a semiconductor device, in accordance with some embodiments of the present disclosure.

FIG. 5 is a diagram of a semiconductor device 5, in accordance with some embodiments of the present disclosure. Referring to FIG. 5, the semiconductor device 5 is similar to the semiconductor device 2 described and illustrated with reference to FIG. 2 except that, for example, the first III-V layer 18H and the second III-V layer 18L belong to a same III-V family. In fabrication, a semiconductor layer 42 of the III-V family is formed on the first conductive layer 16 and the second conductive layer 14. Subsequently, an isolation region 44 is formed between the first III-V layer 18H and the second III-V layer 18L in the semiconductor layer 42 by, for example, implanting a negative-type dopant.

With the isolation region 44, a two-dimensional electron gas (2-DEG) generated in the first III-V layer 18H does not flow into the second III-V layer 18L because negatively-charged ions in the isolation region 44 repel electrons from the first III-V layer 18H. Also, a two-dimensional electron gas (2-DEG) generated in the second III-V layer 18L does not flow into the first III-V layer 18H because negatively-charged ions in the isolation region 44 repel electrons from the second III-V layer 18L. In an embodiment, material of the isolation region 44 includes silicon dioxide, silicon nitride, silicon oxynitride, aluminum oxide, silicon carbide, gallium nitride. Accordingly, the isolation region 44 is configured to electrically isolate the first III-V layer 18H from the second III-V layer 18L.

As compared to the embodiment of FIG. 2 that the first III-V layer 18H is physically isolated from the second III-V layer 18L, in the present embodiment, to achieve better isolation, the isolation region 44 requires a wider area. As a result, the first III-V layer 16 is separated from the second III-V layer 18L by a distance W3 greater than the distance W2. In an embodiment, the distance W3 is approximately 100 um.

In the semiconductor device 5, as previously discussed with reference to FIG. 1B, the first transistor M1 and the second transistor M2 have their respective bulks, the first conductive layer 16 and the second conductive layer 14. In addition, the first conductive layer 16 is electrically isolated from the second conductive layer 14 and the substrate 12. Moreover, the first conductive layer 16 is biased at the same voltage level as the source terminal SH of the first transistor M1 by the conductive feature 22. Effectively, the first transistor M1 is kept at a conducted state when conducted and therefore work normally.

Figure 6:
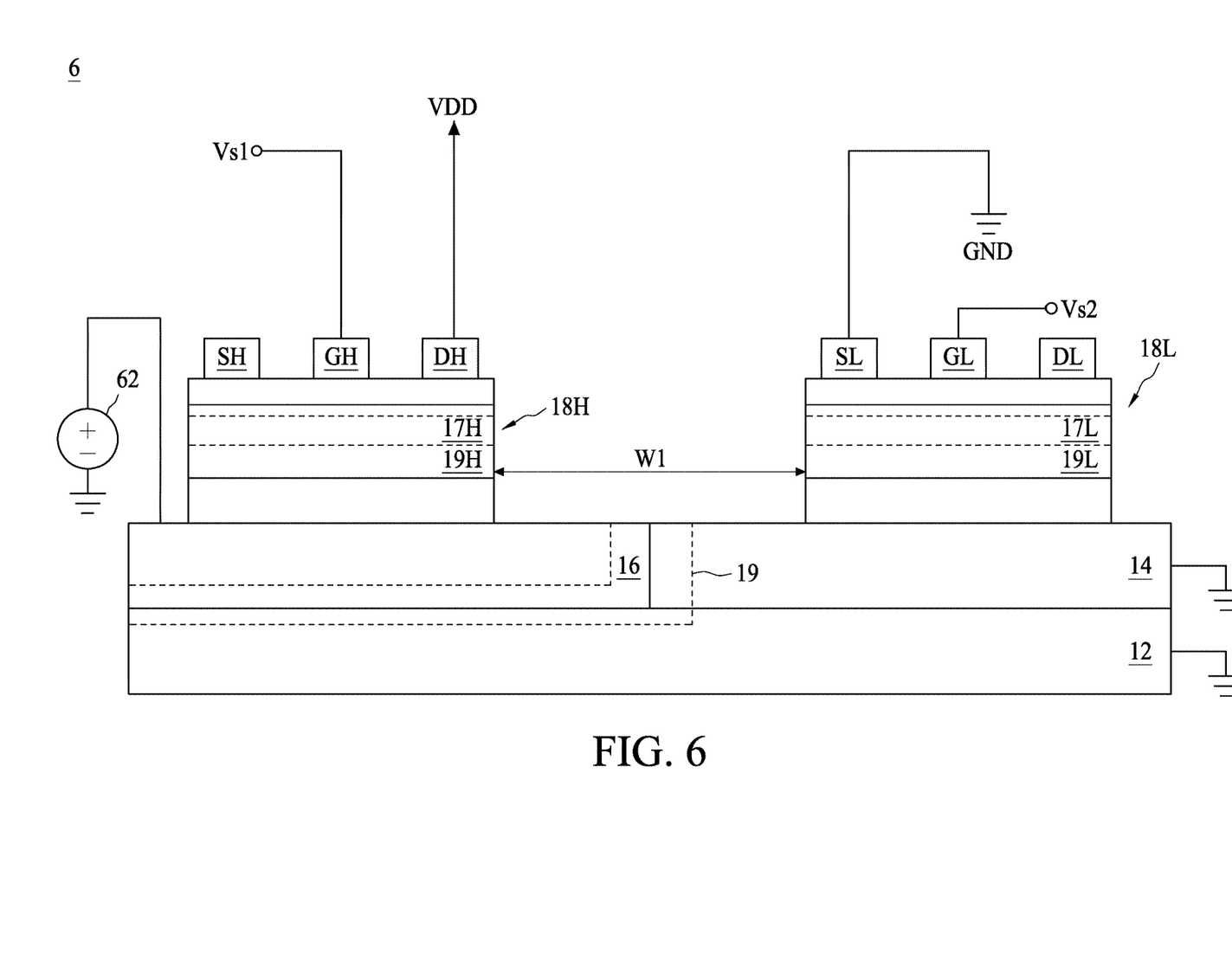
FIG. 6 is a diagram of a semiconductor device, in accordance with some embodiments of the present disclosure.

FIG. 6 is a diagram of a semiconductor device 6, in accordance with some embodiments of the present disclosure. Referring to FIG. 6, the semiconductor device 6 is similar to the semiconductor device 1 described and illustrated with reference to FIG. 1B except that, for example, the semiconductor device 6 replaces the conductive feature 22 with a voltage source 62.

The voltage source 62 is configured to provide a voltage Vs to the first conductive layer 16. The voltage Vs is substantially equal to voltage level of the signal Vs1. As a result, when the gate GH of the first transistor M1 receives the signal Vs1, the first conductive layer 16 has substantially the same voltage level as the source terminal SH of the first transistor M1. Effectively, as previously discussed with reference to FIG. 1B, the first channel 17H can be held and the first transistor M1 is kept at a conducted state when conducted.

In the semiconductor device 6, as previously discussed with reference to FIG. 1B, the first transistor M1 and the second transistor M2 have respective bulks, the first conductive layer 16 and the second conductive layer 14. In addition, the first conductive layer 16 is electrically isolated from the second conductive layer 14 and the substrate 12. Furthermore, the first conductive layer 16 is biased at the same voltage level as the source terminal SH of the first transistor M1 by the voltage Vs. Effectively, the first transistor M1 is kept conducted and therefore works normally.

Figure 7:
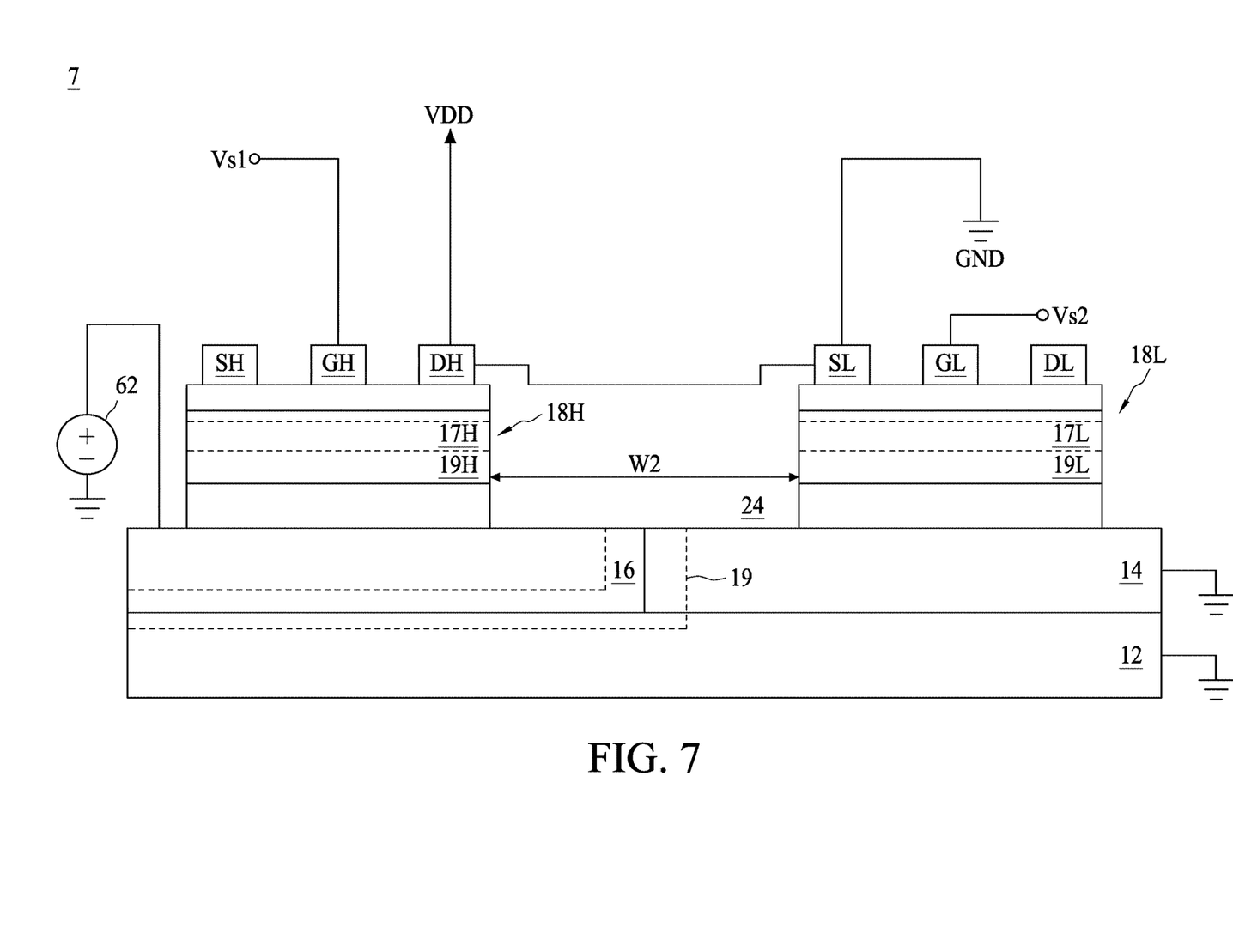
FIG. 7 is a diagram of a semiconductor device, in accordance with some embodiments of the present disclosure.

FIG. 7 is a diagram of a semiconductor device 7, in accordance with some embodiments of the present disclosure. Referring to FIG. 7, the semiconductor device 7 is similar to the semiconductor device 2 described and illustrated with reference to FIG. 2 except that, for example, the semiconductor device 7 replaces the conductive feature 22 with a voltage source 62.

Figure 8:
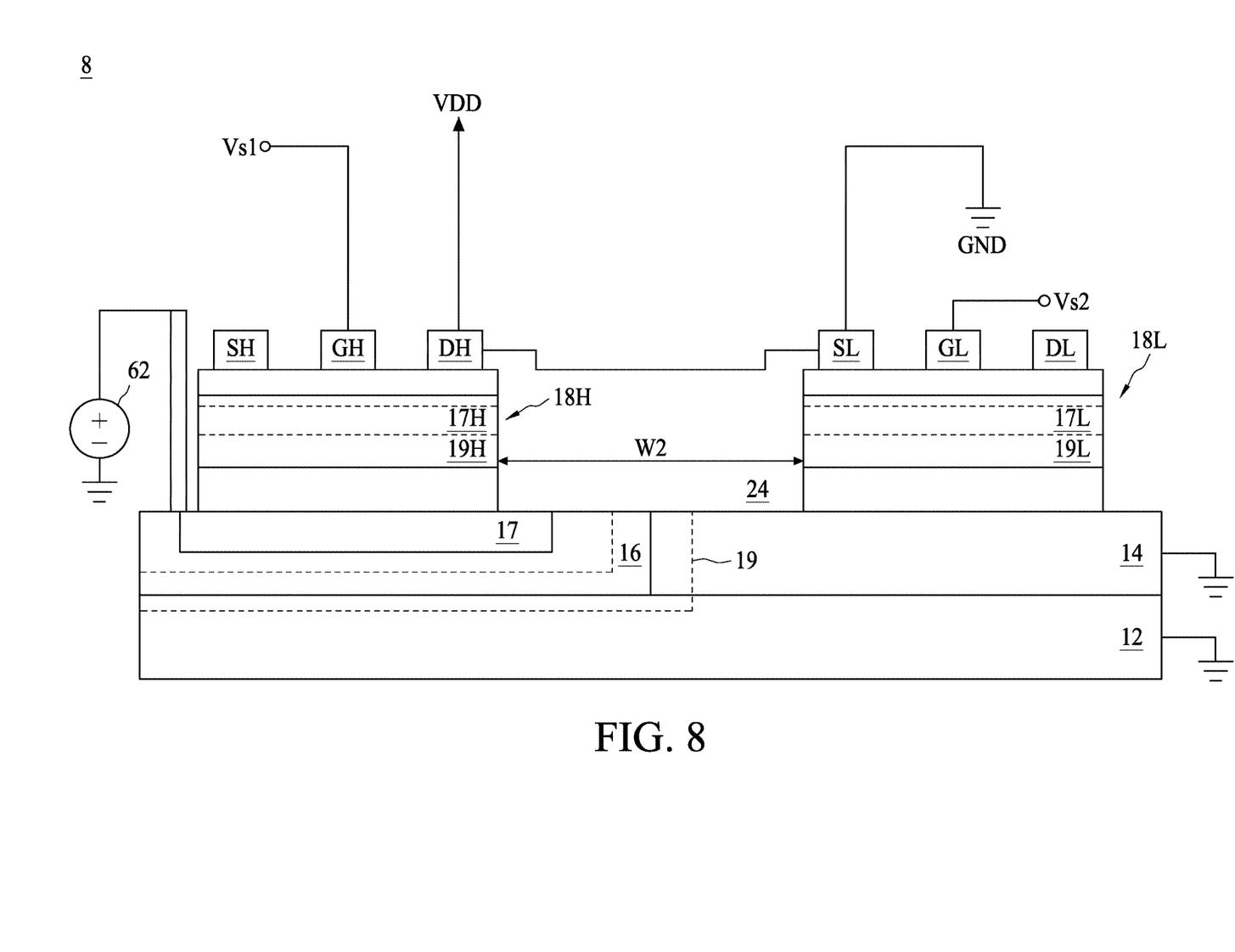
FIG. 8 is a diagram of a semiconductor device, in accordance with some embodiments of the present disclosure.

FIG. 8 is a diagram of a semiconductor device 8, in accordance with some embodiments of the present disclosure. Referring to FIG. 8, the semiconductor device 8 is similar to the semiconductor device 3 described and illustrated with reference to FIG. 3 except that, for example, the semiconductor device 8 replaces the conductive feature 22 with a voltage source 62. Both the conductive layer 17 and the first conductive layer 16 are coupled to the voltage source 62, and therefore the conductive layer 17 has the same voltage level as the first conductive layer 16. As a result, when the gate GH of the first transistor M1 receives the signal Vs 1, the first conductive layer 16 and the conductive layer 17 have substantially the same voltage level as the source terminal SH of the first transistor M1. Effectively, the first channel 17H can be held and the first transistor M1 is kept at a conducted state when conducted.

Figure 9:
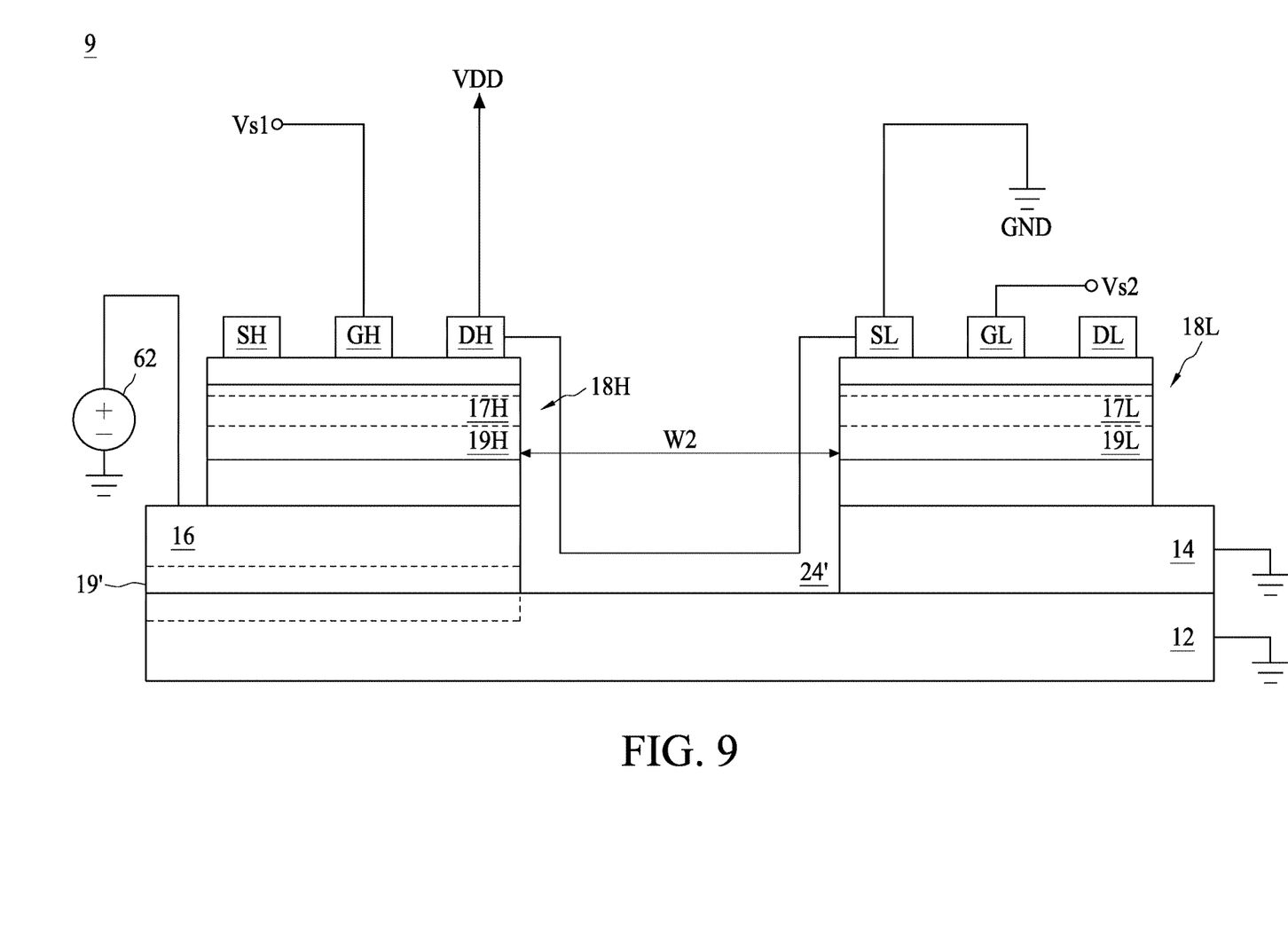
FIG. 9 is a diagram of a semiconductor device, in accordance with some embodiments of the present disclosure.

FIG. 9 is a diagram of a semiconductor device 9, in accordance with some embodiments of the present disclosure. Referring to FIG. 9, the semiconductor device 9 is similar to the semiconductor device 4 described and illustrated with reference to FIG. 4 except that, for example, the semiconductor device 9 replaces the conductive feature 22 with a voltage source 62.

Figure 10:
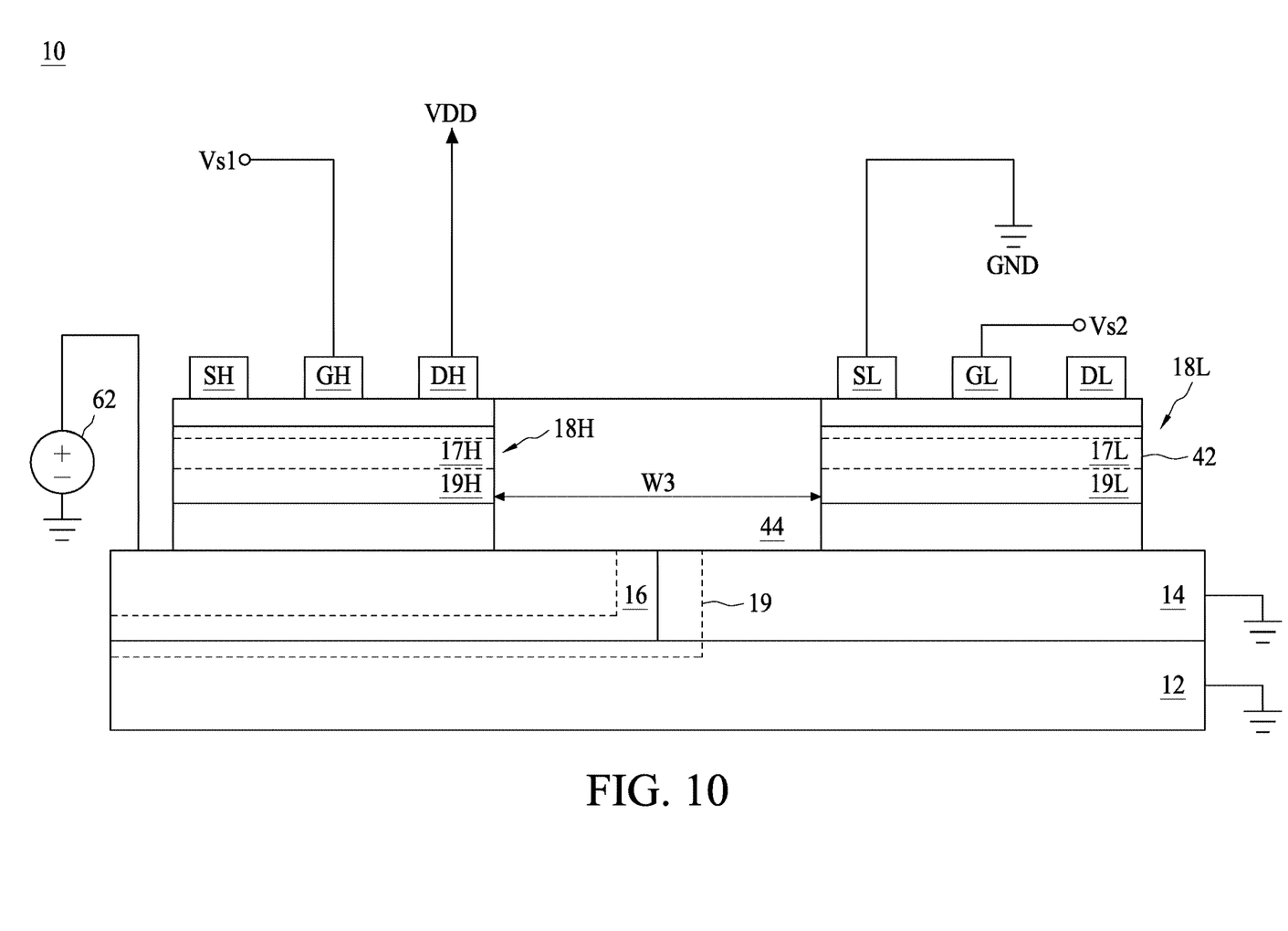
FIG. 10 is a diagram of a semiconductor device, in accordance with some embodiments of the present disclosure.

FIG. 10 is a diagram of the semiconductor device 10, in accordance with some embodiments of the present disclosure. Referring to FIG. 10, the semiconductor device 10 is similar to the semiconductor device 5 described and illustrated with reference to FIG. 5 except that, for example, the semiconductor device 10 replaces the conductive feature 22 with a voltage source 62.

Some embodiments have one or a combination of the following features and/or advantages. In some embodiments, a semiconductor device includes a transistor, a semiconductor layer, an active region and a conductive layer. The active region is in the semiconductor layer. The conductive layer is configured to maintain a channel in the active region when the transistor is triggered to be conducted In some embodiments, a semiconductor device includes a substrate and a transistor. The transistor is disposed on the substrate. The transistor includes a semiconductor layer, an active region and a conductive layer. The active region is defined in the semiconductor layer. The conductive layer is configured to receive a voltage, the voltage level of the conductive layer to determine whether a channel is held in the active region. The conductive layer is configured to be electrically isolated from the substrate.

In some embodiments, a semiconductor device includes a first transistor and a second transistor. The second transistor is integrated with the first transistor. The first transistor is configured to receive a supply voltage. The second transistor is configured to receive a reference voltage. The first transistor includes a first semiconductor layer, a first active region and a first conductive layer. The first active region is defined in the first semiconductor layer. The first conductive layer is configured to receive a voltage, the voltage level of the first conductive to determine whether a first channel is held in the first active region. The second transistor includes a second semiconductor layer, a second active region and a second conductive layer. The second active region is defined in the second semiconductor layer. The second conductive layer is electrically isolated from the first conductive layer, and configured to receive a voltage. The voltage level of the second conductive layer is to determine whether a second channel is held in the second active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
  a first device formed on a substrate, the first device including:
    a first conductive layer having a first dopant type;
    a second conductive layer formed in the first conductive layer, wherein the second conductive layer has a second dopant type;
    a first III-V semiconductor layer disposed over the first conductive layer and the second conductive layer; and
    a first gate, a first source, and a first drain formed over the first III-V semiconductor layer;
  a second device formed on the substrate, the second device including:
    a third conductive layer;

a second III-V semiconductor layer disposed over the third conductive layer; and a second gate, a second source, and a second drain formed over the second III-V semiconductor layer; and wherein the first III-V semiconductor layer and the second III-V semiconductor layer are separated by a distance and a dielectric material is disposed within at least a portion of the distance, wherein the dielectric material interfaces the first conductive layer, the second conductive layer, and the third conductive layer.

2. The semiconductor device of claim 1, wherein the dielectric material interfaces an uppermost surface of the first conductive layer, an uppermost surface of the second conductive layer, and an uppermost surface of the third conductive layer.

3. The semiconductor device of claim 1, wherein the first conductive layer and the second conductive layer are coupled to a same terminal.

4. The semiconductor device of claim 1, wherein the first conductive layer and the second conductive layer are coupled to the first source.

5. The semiconductor device of claim 4, wherein a conductive feature extends from an upper surface of the first conductive layer and the second conductive layer to the terminal of the first source.

6. The semiconductor device of claim 1, wherein the first conductive layer and the second conductive layer are at a same voltage level.

7. The semiconductor device of claim 1, wherein the dielectric material has an uppermost surface having a first portion and a third portion each at a first height and a second portion at a second height, wherein the second portion interposes the first and third portions and wherein the second height is less than the first height.

8. The semiconductor device of claim 1, wherein the second conductive layer has a bottommost surface interfacing a surface of the first conductive layer.

9. A semiconductor device, comprising:
a first controller and a second controller;
a first III-V semiconductor transistor device formed on a substrate, the first III-V semiconductor transistor device formed over a first conductive layer having a first dopant type; and
a second III-V semiconductor transistor device formed on the substrate, the second III-V semiconductor transistor device formed over a second conductive layer having a second dopant type;
a load connected to a source terminal of the first III-V semiconductor transistor device and a drain terminal of the second III-V semiconductor transistor device; and
an insulator layer extending between the first III-V semiconductor transistor device and the second III-V semiconductor transistor device, the insulator layer disposed on the first conductive layer and the second conductive layer.

10. The semiconductor device of claim 9, wherein the first III-V semiconductor transistor device includes a gate terminal connected to the first controller and the second III-V semiconductor transistor device includes a gate terminal connected to the second controller.

11. The semiconductor device of claim 9, wherein a source terminal of the second III-V semiconductor transistor device is connected to ground.

12. The semiconductor device of claim 9, wherein a drain terminal of the first III-V semiconductor transistor device is connected to a supply voltage.

13. The semiconductor device of claim 9, wherein the second conductive layer is connected to ground.

14. The semiconductor device of claim 9, further comprising: a depletion region formed at an interface between the first conductive layer and the second conductive layer.

15. The semiconductor device of claim 9, further comprising: a conductive feature coupling the source terminal of the first III-V semiconductor transistor device and the first conductive layer.

16. A semiconductor device, comprising:
a first III-V semiconductor transistor device formed on a substrate, the first III-V semiconductor transistor device formed over a first conductive layer having a first dopant type;
a second III-V semiconductor transistor device formed on the substrate, the second III-V semiconductor transistor device formed over a second conductive layer having a second dopant type;
an insulator layer extending between the first III-V semiconductor transistor device and the second III-V semiconductor transistor device, the insulator layer disposed on the first conductive layer and the second conductive layer; and
the first conductive layer connected to one of a source terminal of the first III-V semiconductor transistor device or a voltage source.

17. The semiconductor device of claim 16, wherein the first conductive layer connected to the source terminal of the first III-V semiconductor transistor device by a conductive feature extending from an upper surface of the first conductive layer to the source terminal.

18. The semiconductor device of claim 16, further comprising: another conductive layer formed within the first conductive layer and under the first III-V semiconductor transistor device.

19. The semiconductor device of claim 18, wherein the another conductive layer and the first conductive layer have opposite dopant types.

20. The semiconductor device of claim 18, wherein the another conductive layer is connected to the one of the source terminal of the first III-V semiconductor transistor device or the voltage source connected to the first conductive layer.

* * * * *